United States Patent
Chen et al.

(10) Patent No.: US 7,307,773 B2
(45) Date of Patent: Dec. 11, 2007

(54) MICRO-OPTOELECTROMECHANICAL SYSTEM PACKAGES FOR A LIGHT MODULATOR AND METHODS OF MAKING THE SAME

(75) Inventors: Chien-Hua Chen, Corvallis, OR (US); David M. Craig, Albany, OR (US); Charles C. Haluzak, Corvallis, OR (US)

(73) Assignee: Hewlett-Packard Development Company, L.P., Houston, TX (US)

(*) Notice: Subject to any disclaimer, the term of this patent is extended or adjusted under 35 U.S.C. 154(b) by 107 days.

(21) Appl. No.: 11/029,316

(22) Filed: Jan. 4, 2005

(65) Prior Publication Data

US 2006/0146426 A1    Jul. 6, 2006

(51) Int. Cl.
- *G02B 26/00* (2006.01)
- *H01L 23/24* (2006.01)
- *H01L 23/34* (2006.01)
- *H01L 21/00* (2006.01)

(52) U.S. Cl. .............. 359/290; 359/291; 257/680; 257/687; 257/706; 257/723; 438/104; 438/107; 438/123; 324/158.1

(58) Field of Classification Search ............ 359/290, 359/291, 295, 298, 507, 508, 511–514, 808–812; 438/51, 53, 107, 108, 113, 114, 460, 586, 438/104, 122, 123; 257/415, 416, 680, 687, 257/706, 710, E23.114, E23.137, E23.193, 257/E31.117; 324/158.1, 751–753; 216/33, 216/39, 56; 348/E5.142; 353/31, 50, 97, 353/98

See application file for complete search history.

(56) References Cited

U.S. PATENT DOCUMENTS

| | | | |
|---|---|---|---|
| 6,303,986 B1 * | 10/2001 | Shook | 257/680 |
| 6,470,594 B1 * | 10/2002 | Boroson et al. | 34/335 |
| 6,489,178 B2 | 12/2002 | Coyle et al. | |
| 6,538,312 B1 * | 3/2003 | Peterson et al. | 257/680 |
| 6,541,832 B2 | 4/2003 | Coyle | |
| 6,594,916 B2 * | 7/2003 | Boroson et al. | 34/335 |
| 6,656,768 B2 | 12/2003 | Thomas | |
| 6,664,779 B2 * | 12/2003 | Lopes et al. | 324/158.1 |
| 6,686,653 B2 * | 2/2004 | Jerominek et al. | 257/680 |
| 6,740,145 B2 * | 5/2004 | Boroson et al. | 96/108 |
| 6,764,875 B2 * | 7/2004 | Shook | 438/106 |
| 6,818,479 B2 * | 11/2004 | Boroson et al. | 438/127 |
| 6,853,067 B1 * | 2/2005 | Cohn et al. | 257/704 |
| 6,872,984 B1 * | 3/2005 | Leung | 257/81 |
| 6,879,147 B2 * | 4/2005 | Lopes et al. | 324/158.1 |
| 6,903,860 B2 * | 6/2005 | Ishii | 359/290 |
| 7,019,886 B2 * | 3/2006 | Chen et al. | 359/290 |
| 7,042,623 B1 * | 5/2006 | Huibers et al. | 359/291 |
| 7,045,885 B1 * | 5/2006 | Chen et al. | 257/678 |
| 7,091,605 B2 * | 8/2006 | Boroson et al. | 257/723 |
| 2004/0190112 A1 | 9/2004 | Huibers | |
| 2005/0170614 A1 * | 8/2005 | Patel et al. | 438/460 |

* cited by examiner

*Primary Examiner*—Loha Ben

(57) ABSTRACT

A micro-optoelectromechanical system (MOEMS) package for a light modulator includes a sealed modulator package containing a light modulator sealed under a first transparent lid; a secondary, larger package containing the sealed modulator package, the secondary package comprising a seal and a second transparent lid; and an optical material disposed between the first transparent lid and the second transparent lid, where the optical material is a solid, gel or liquid. An alternatively micro-optoelectromechanical system (MOEMS) package for a light modulator includes a sealed modulator package containing a light modulator sealed under a first transparent lid; a secondary, larger package containing the sealed modulator package; and a desiccant or getter material disposed inside the secondary package with the modulator package.

62 Claims, 7 Drawing Sheets

MICRO-OPTOELECTROMECHANICAL SYSTEM PACKAGES FOR A LIGHT MODULATOR AND METHODS OF MAKING THE SAME

BACKGROUND

Video projection systems are widely used in a variety of applications. For example, video projection systems, both forward and rear projection systems, are widely used in "big screen" home entertainment systems to provide a much larger picture than is economically available using a conventional cathode ray tube. Additionally, video projection systems may be used in a theater to display a movie or other video program for a relatively large audience. Video projection systems are also used in business, education, training and other areas to display presentations such as, pictures, graphs, charts, outlines, a computer desktop etc., for a number of people to view. Because video projection systems are so widely used, there is a constant desire to improve on known video projection systems.

In general, a projection system is provided with a video signal bearing the image or images to be projected. A lamp produces a powerful light beam that is then directed to a micro-opto-electro-mechanical system (MOEMS) device. The MOEMS device is a light modulator that modulates incident light in a spatial pattern that corresponds to the image of the incoming video signal. Thus, the modulator is driven with the incoming video signal to produce the image to be projected. The light from the projection lamp is then passed through, or reflected from, the modulator to project the image on the modulator to a screen or other display surface.

One type of light modulator includes an array of micromirrors mounted on movable elements. Each individual micromirror can be independently deflected by an electrostatic force. Thus, when a light beam is directed onto the array of micromirrors, each of the mirrors will reflect light in varying amounts depending on the deflection and consequent orientation of that mirror. Each mirror can thus be used to represent a pixel of the image from the incoming video signal.

To produce a bright pixel, the deflection or orientation of the micromirror associated with that pixel is controlled such that the reflected light from the micromirror is directed into the projection optics of the projection system for projection. To produce a dark pixel, the deflection or orientation of the micromirror is controlled such that the reflected light from the micromirror is directed away from the projection optics. In order to display a black-and-white image, the micromirror array is illuminated by a beam of light. By coordinating the reflective status of the micromirrors based on the brightness of the pixels of the desired image, the collective effect of all reflected light from individual micromirrors is the generation of the desired image. Gray-scale and color images can also be produced using the micromirror array.

The micromirror array is a delicate device. Its performance can be significantly degraded by, for example, moisture or contaminants that may adhere to any of the micromirrors or by changes to the internal operating environment such as pressure and gas constituents. For this and other reasons, micromirror array devices need to be packaged after fabrication. For example, see U.S. Patent Application Publication No. 2004/0190112 to Huibers, Sep. 30, 2004, which is incorporated herein by reference in its entirety.

SUMMARY

A micro-optoelectromechanical system (MOEMS) package for a light modulator includes a sealed modulator package containing a light modulator sealed under a first transparent lid; a secondary, larger package containing the sealed modulator package, the secondary package comprising a seal and a second transparent lid; and an optical material disposed between the first transparent lid and the second transparent lid, where the optical material is a solid or liquid. An alternatively micro-optoelectromechanical system (MOEMS) package for a light modulator includes a sealed modulator package containing a light modulator sealed under a first transparent lid; a secondary, larger package containing the sealed modulator package; and a desiccant or getter material disposed inside the secondary package with the modulator package.

BRIEF DESCRIPTION OF THE DRAWINGS

The accompanying drawings illustrate various embodiments of the present invention and are a part of the specification. The illustrated embodiments are merely examples of the present invention and do not limit the scope of the invention.

Throughout the drawings, identical reference numbers designate similar, but not necessarily identical, elements.

DETAILED DESCRIPTION

The present specification describes MOEMS packages and methods of making a MOEMS package for an optical light modulator that protects the modulator without significant light loss due to reflection. The modulator package is itself sealed and is then placed in a second, larger package that is also sealed. An index-matching material is deposited between the sealed modulator package and the transparent lid of the larger package to mitigate any light loss due to reflection. A desiccant or getter material can also be sealed into the larger package to further protect the system in the modulator package.

Figure 1:
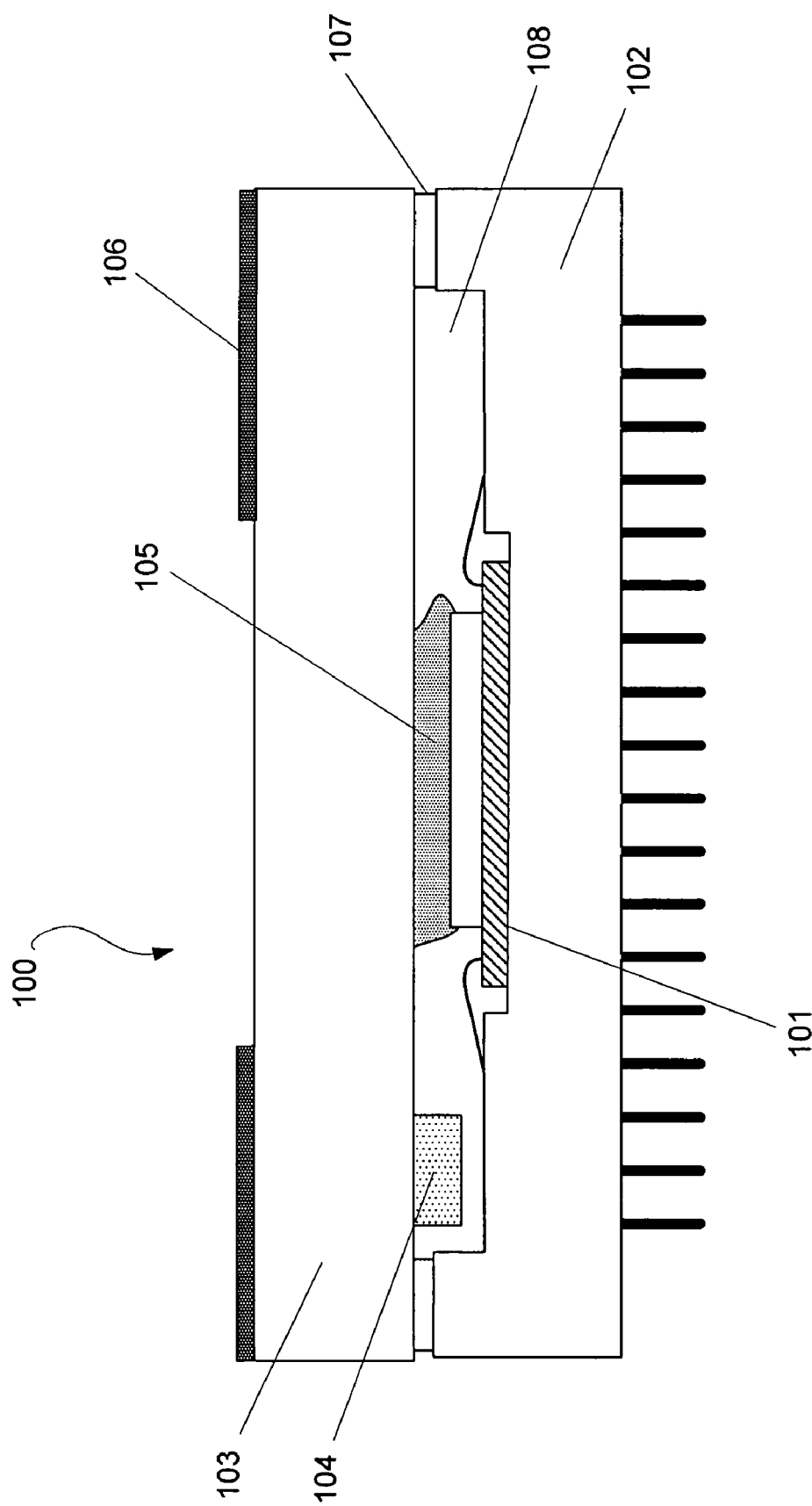
FIG. 1 illustrates a cross section of a MOEMS package for an optical light modulator according to principles described herein.

FIG. 1 illustrates a cross section of a MOEMS package for an optical light modulator according to principles described herein. This package will be explained in detail below. However, we first consider the sealed package of the modulator which is a component of the larger package illustrated in FIG. 1.

Figure 2:
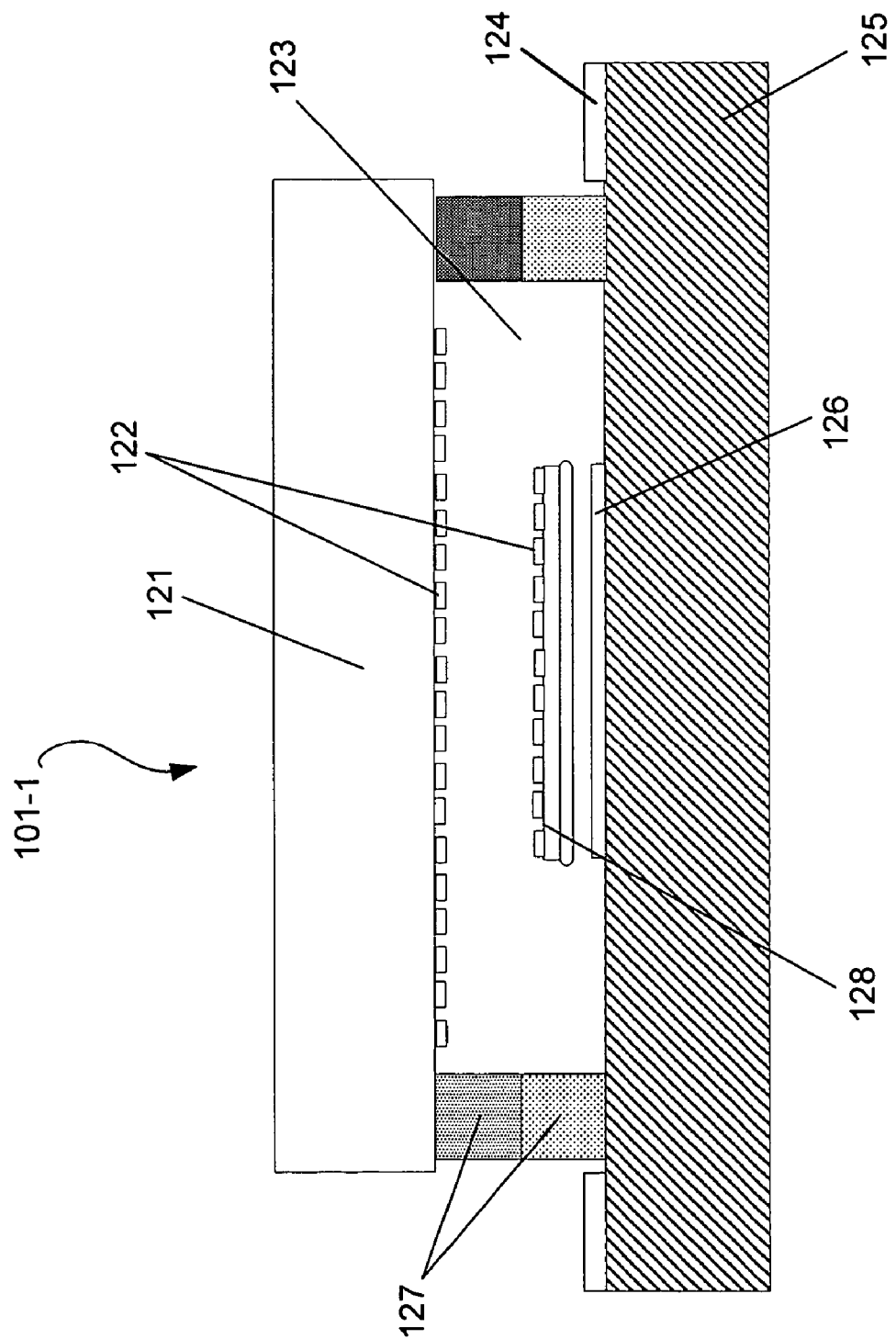
FIG. 2 illustrates a cross section of one example of an optical light modulator package that can be used within the larger package illustrated in FIG. 1.

FIG. 2 illustrates a cross section of one example of an optical light modulator package that can be used within the larger package illustrated in FIG. 1. FIG. 2 illustrates a modulator package (101-1). In this modulator (101-1), a pixel array (128) includes, for example, an array of micromirrors. As described above, each of the micromirrors of the pixel array (128) is individually addressable and can be deflected such that the pixel array (128) forms an image based on an incoming video signal. A light beam can then be directed to, spatially modulated by, and reflected from the pixel array (128) to project the desired image.

The pixel array (128) is formed on a substrate (125) over an electrode (126) that is used to drive the pixel array (128). The electrode (126) is electrically connected to contact pads (124) on the substrate (125). The contact pads (124) are used to connect the modulator (101-1) to a larger circuit of a projection system. The signal for driving the pixel array (128) is delivered through the contact pads (124) to the electrode (126).

The pixel array (128) is placed in a sealed environment (123) to protect it from the ambient environment and maintain the internal operating environment. As described above, changes to the internal operating environment can be extremely detrimental or debilitating to the operation of the pixel array (128) with its micromirror array. Consequently, the pixel array (128) is sealed under a transparent lid (121), such as a glass lid.

In the example illustrated in FIG. 2, an antireflective (AR) coating is provided on the underside of the transparent lid (121) and over the top of the pixel array (128). The glass lid (121) is bonded to the substrate (125) over the pixel array (128) with a bond ring (127). The bond ring (127) may be, for example, oxide, solder, epoxy, or polymer. In this way, the pixel array (128) is hermetically, near-hermetically or semi-hermetically sealed within the controlled environment (123).

The advantages of putting a lid (121) over the pixel array (128) at the wafer level include being able to release the MOEMS structures and create the desired internal operating environment (123) and functionally test the parts at the wafer level. Another advantage is that the released structures are fully protected during the wafer saw or singulation process. Finally, wafer scale packaging can be a low cost alternative to processing the individual die one at a time.

In the example of FIG. 2, the controlled environment (123) or internal volume of the package (101-1) is very small, for example, less then 0.01 cc. With such a low volume, even a very fine leak (~$10^{-9}$ atm cc/s) results in changes to the internal environment, which can be detrimental to the operation of the pixel array (128), in a short period of time. Therefore, any leak in the bond ring (127) can quickly change the internal operating environment of the package (101-1). Consequently, the modulator package can be sealed, as described herein, into a secondary, larger package. In such a case, any leak in the bond ring (127) will merely connect the controlled environment of the larger package with the controlled environment inside the modulator package. Moreover, the degree to which both packages are hermetically sealed can be relaxed somewhat due to the double package, double seal configuration.

FIG. 1 illustrates a cross section of a MOEMS package for an optical light modulator according to principles described herein. As shown in FIG. 1, a hermetically, near-hermetically or semi-hermetically sealed modulator package, such as the package described above with respect to FIG. 2, is sealed within a larger, secondary package.

Referring to FIG. 1, the modulator package (101), which is, for example, the modulator package illustrated in FIG. 2 and described above, is tacked or adhered to a substrate (102) of a secondary package. The substrate (102) may be part of, for example, a Plastic Pin Grid Array (PGA), Ceramic Pin Grid Array (CPGA) or plastic Light Communications Package (LCP). The substrate (102) may also be part of a Kovar® package, where Kovar® is an alloy of nickel, cobalt and iron. The contact pads of the modulator package (101) are then connected to an electrical circuit of the substrate (102).

A transparent lid (103), for example, a glass lid, is then sealed over the modulator package (101). A bond ring (107) is formed between the glass lid (103) and the substrate (102). The bond ring (107) may be, for example, oxide, solder, epoxy, or polymer.

The bond (107) creates a seal between the lid (103) and substrate (102) that is hermetic, near-hermetic or, at least, semi-hermetic. For example, if the seal is hermetic, the bond (107) may be a low cost package with a leak rate less than $10^{-8}$ atm.cc/sec. A near- or semi-hermetic seal would have a greater leak rate.

An aperture (106) may be formed on the glass lid (103) to limit the angle of incidence of the light of a projection beam being directed to and reflected from the modulator package (101). The aperture (106) may be, for example, a non-transparent mask formed on the outer surface of the glass lid (103) leaving a window that is aligned with or registered over the modulator package (101).

With the glass lid (103) sealed over the modulator package (101), a second controlled environment (108) is formed around the outside of the modulator package (101). As described above, any leak in the seal of the modulator package (101) will consequently not expose the pixel array (128, FIG. 2) to the ambient environment, but will merely expose the controlled environment (123, FIG. 2) inside the modulator package (101) to the controlled environment (108) inside the larger package formed by the substrate (102) and the glass lid (103). This controlled environment (108) does not need to be at atmosphere, but can be at a pressure above or below atmospheric, and might contain an inert gas such as argon or nitrogen.

A desiccant and/or getter material (104) may be added into the space of the controlled environment (108) of the larger package (100). This desiccant and/or getter material (104) will absorb any moisture and/or collect any dust or other contaminants that may somehow be introduced to the controlled environment (108) of the package (100). This will serve to further ensure that no such contamination ever reaches the sealed interior of the modulator package (101).

An optical material (105) will be placed between the glass lid (105) and the upper surface of the sealed modulator package (101). This optical material (105) will facilitate the transmission of light between the lid (105) and the sealed modulator package (101) to minimize light loss due to reflection.

For example, the optical material (105) may be chosen to have a refraction index that matches the refraction indices of the glass lid (105) and the lid (121, FIG. 2) of the modulator package (101). The refraction index of the optical material (105) may be, for example, a geometric or arithmetic average of the refraction indices of the glass lid (105) and the lid (121, FIG. 2) of the modulator package (101). The index matching does not have to be exact to provide a useful benefit. Thus, some variation from the exact geometric or arithmetic average will still produce a useful result in minimizing unwanted reflection with the optical material (105).

The optical material (105) can be a liquid, gel or solid material. Because the modulator package (101) is sealed, there is little or no concern that the optical material (105) will enter or contaminate the modulator package (101).

With the optical material in place to optically couple the modulator package (101) to the larger package (100) in which the modulator package is sealed, the transmission of light to and from the modulator package is made relatively efficient such that no significant loss of optical efficiency results from placing the modulator package (101) within the second, larger package (100). Consequently, the addition of the larger package (100), and consequent additional protection of the modulator (101), need not result in any significant loss in optical efficiency.

Figure 3:
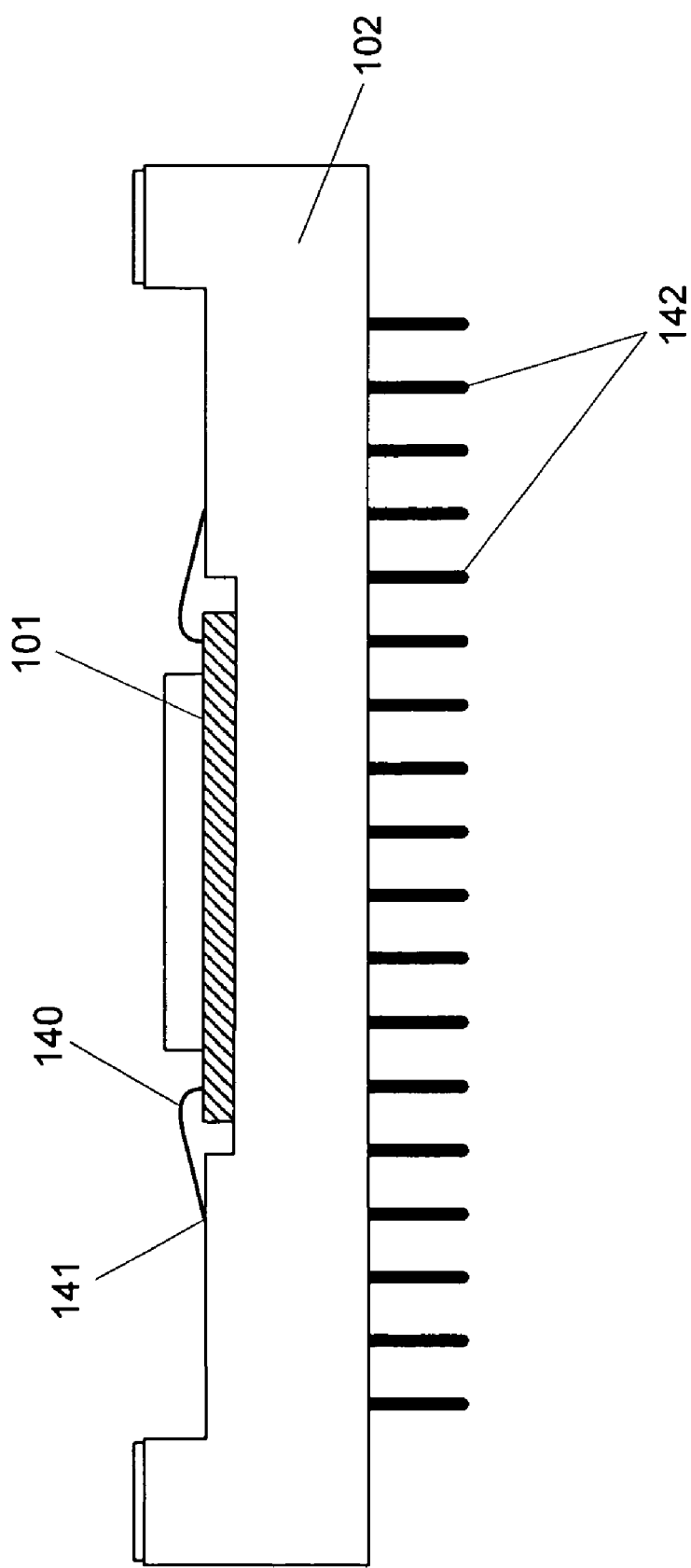
FIGS. 3-5 illustrate various steps in the fabrication of the MOEMS package illustrated in FIG. 1 according to principles described herein.
Figure 4:
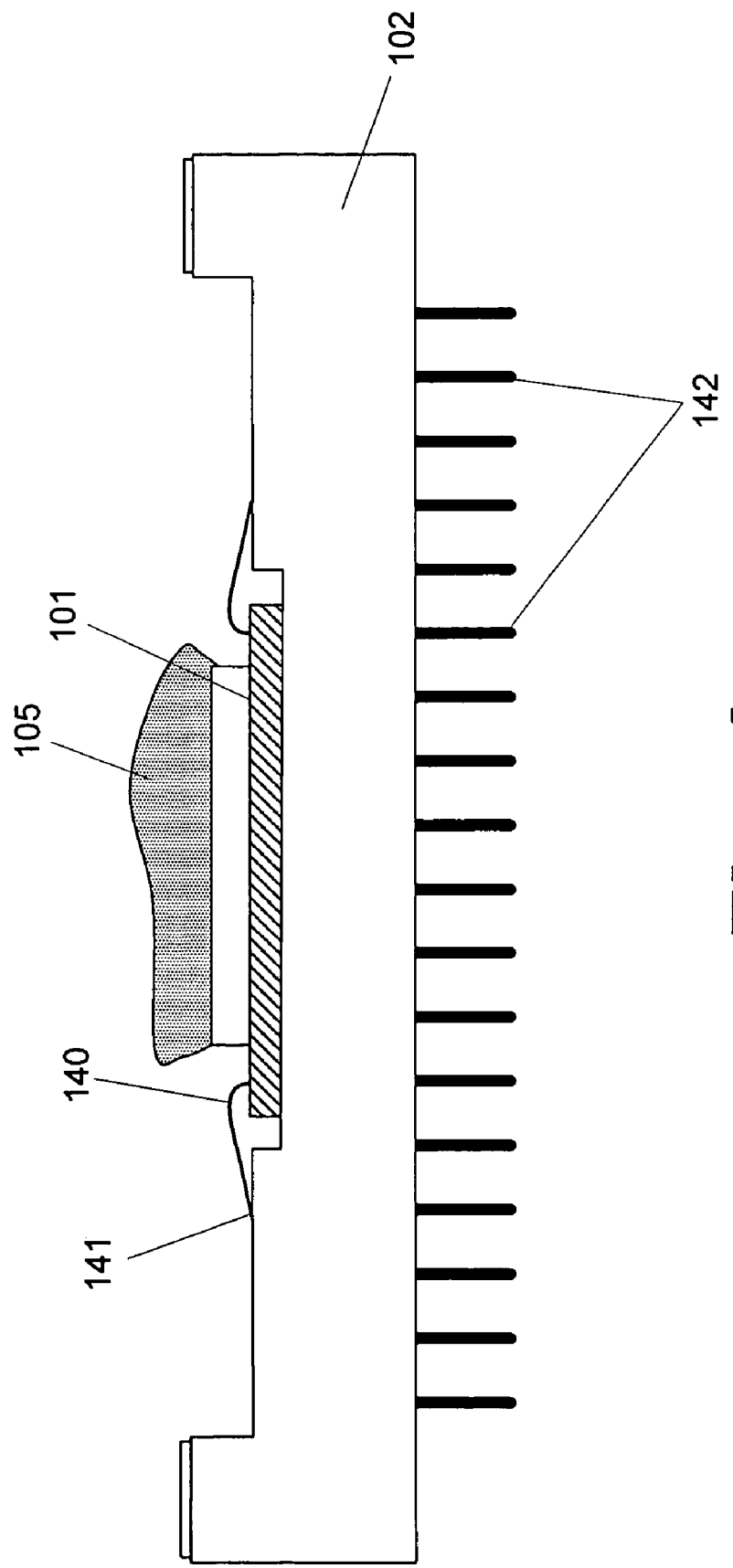
Figure 5:
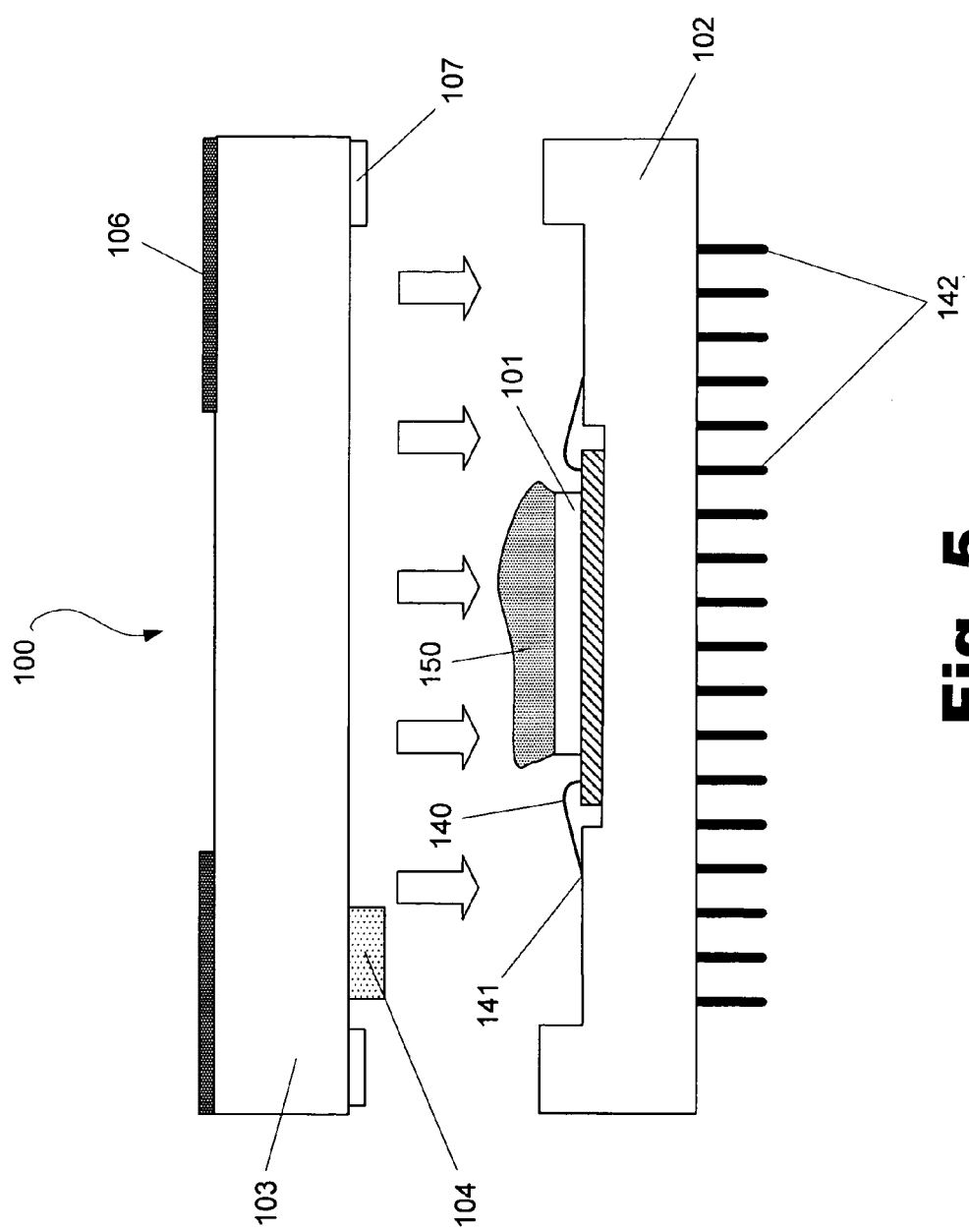

FIGS. 3-5 illustrate various steps in the fabrication of the MOEMS package illustrated in FIG. 1 according to principles described herein. As shown in FIG. 3, the modulator package (101) is tacked or adhered to a substrate (102). A wire bond (140) is then formed between the contact pads (124, FIG. 2) and a circuit (141) formed on the substrate (102). This circuit (141) will typically include a number of pins (142) so that the package (100, FIG. 1) can be connected to a larger circuit of, for example, a projection system using the pins (142).

Turning to FIG. 4, the optical material (105) is placed over the modulator package (101). The optical material (105) has been described above.

As shown in FIG. 5, the transparent lid (103) of the package (100) is then provided. The lid (103) may have an aperture (106) formed thereon with a window registered above the modulator package (101). As described above, this advantageously limits the angle of incidence of light being direct to the modulator (101).

The lid (103) may also have a desiccant and/or getter material (104) disposed thereon. As mentioned above, this material can help maintain a desired environment within the package (100) by absorbing moisture, dust or other contaminants that may somehow penetrate the interior of the package (100) or be trapped inside when the lid is sealed to the substrate. Alternatively, the desiccant and/or getter material can be placed in the controlled environment of the package (100) in some place other than on the lid (103).

As shown in FIG. 5, the lid is then sealed to the substrate (102). This seal should be a hermetic seal, near-hermetic or, at least, a semi-hermetic seal. The finished package (100) is illustrated in FIG. 1.

Figure 6:
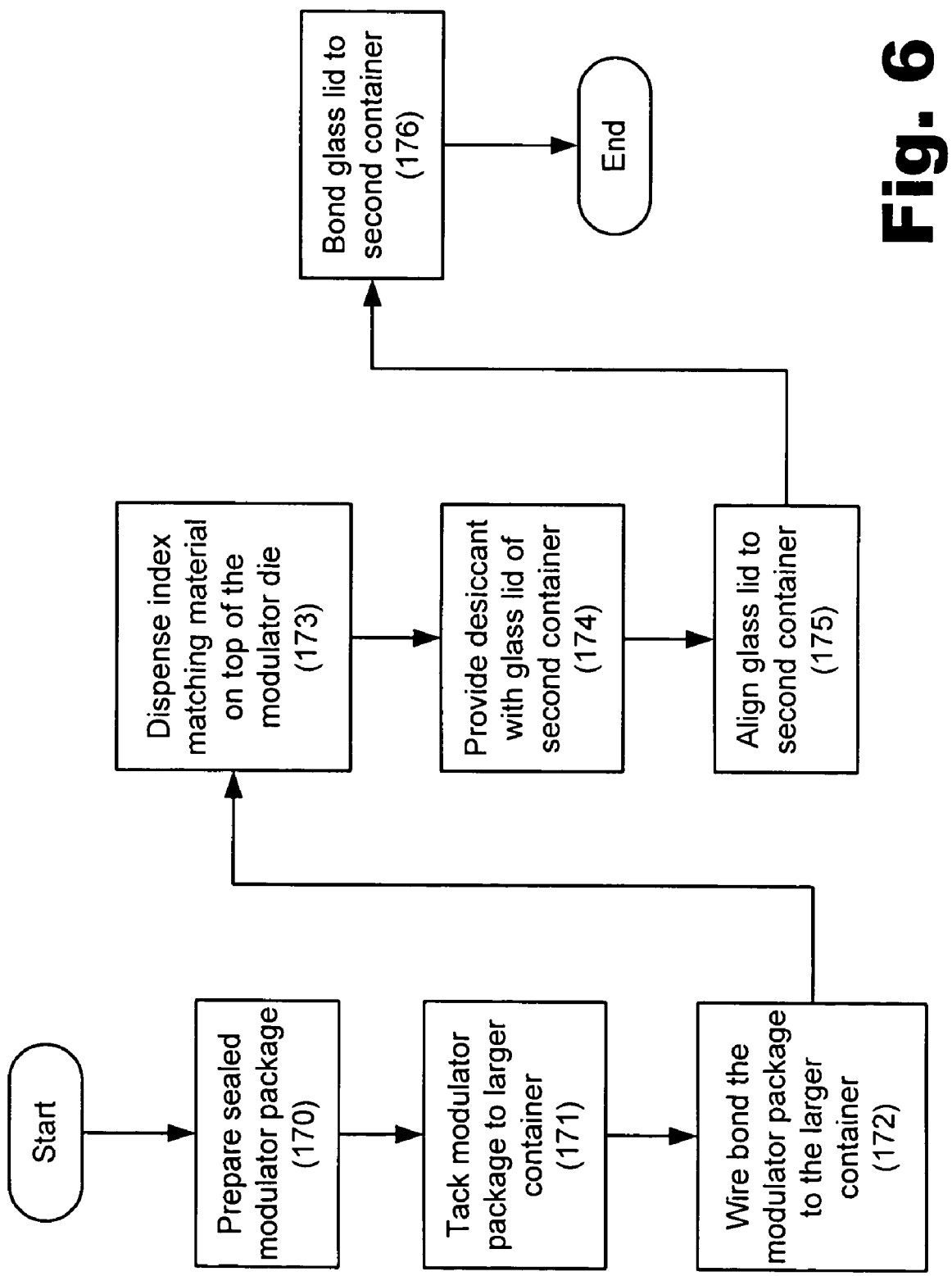
FIG. 6 is a flowchart illustrating a method of fabricating a MOEMS package such as that illustrated in FIG. 1 according to principles described herein.

FIG. 6 is a flowchart illustrating a method of fabricating a MOEMS package such as that illustrated in FIG. 1, according to principles described herein. The various steps of the method illustrated in FIG. 6 are illustrated, as described above, in FIGS. 3-5.

As shown in FIG. 6, the method begins with the preparation of a sealed modulator package (step 170). Examples of this modulator package (101-1) are illustrated in FIG. 2.

Next, the modulator package is tacked or adhered to a larger package or secondary container (step 171). The modulator package is then electrically connected, for example, wire bonded, to the circuit of the larger package (step 172). An optical index matching material is then dispensed over the modulator die to optically couple the modulator die to the larger package (step 173).

A transparent, e.g., glass, lid is then prepared to seal the larger, secondary package (step 174). This lid may include a desiccant and/or getter material as described above. The transparent lid may also have an aperture that is aligned and registered with the modulator die and the optical material on the modulator die (step 175). The transparent lid is then bonded to the substrate to seal the larger, secondary package (step 176).

Figure 7:
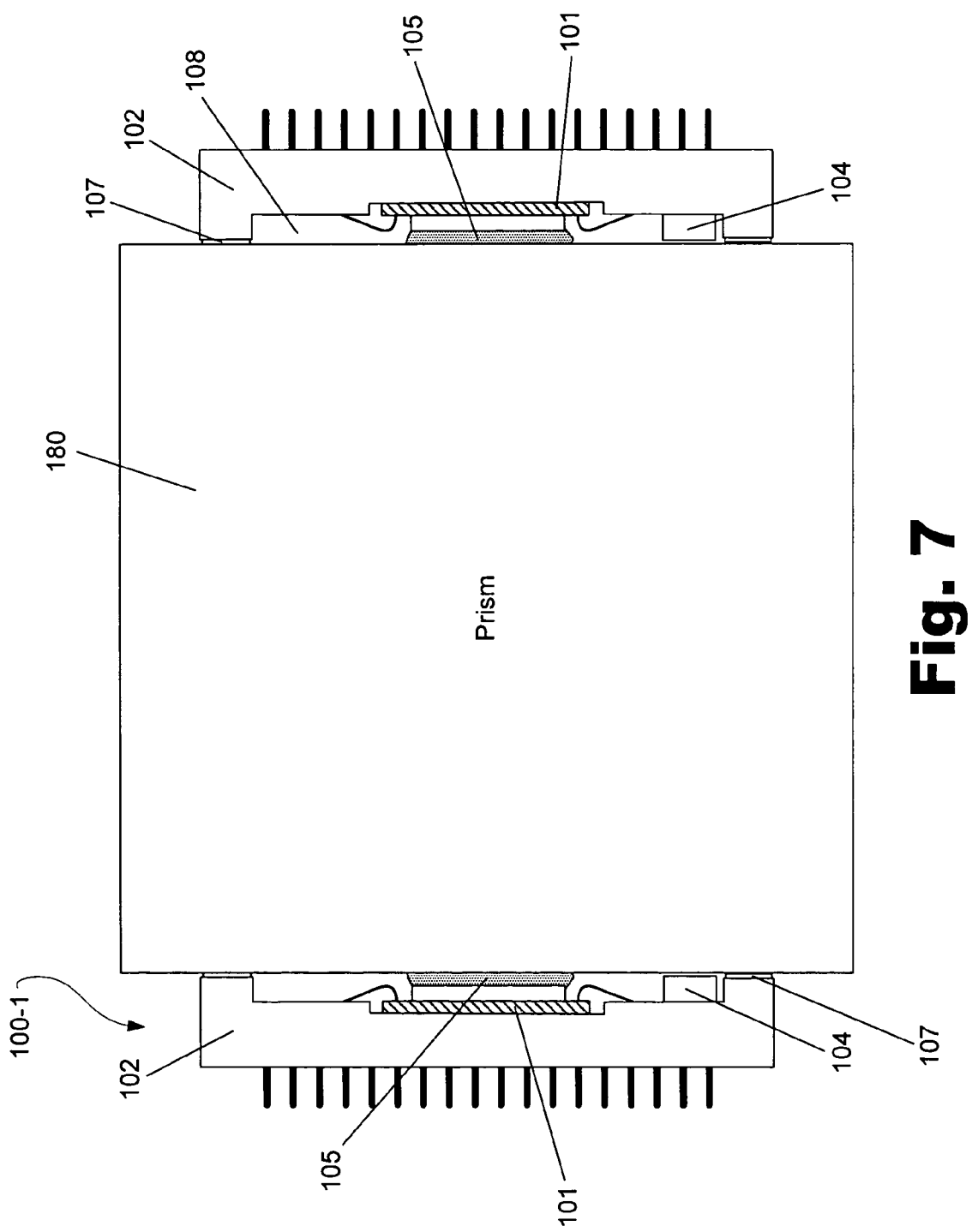
FIG. 7 is an alterative embodiment of a MOEMS package for an optical light modulator according to principles described herein.

FIG. 7 is an alterative embodiment of a MOEMS package for an optical light modulator according to principles described herein. As shown in FIG. 7, instead of being sealed with a glass lid (103, FIG. 1), the MOEMS package (100-1) can be sealed to a prism (180). The prism (180) then functions as the lid (103, FIG. 1) for the package (100-1) in the same manner described above. Desiccant or getter material (104) may be placed on the prism (180) for inclusion in the internal environment (108) of the MOEMS package (100-1).

With a prism (180), a number of MOEMS packages (100-1) can be sealed to different sides of the prism (180) as shown in FIG. 7. Some projection systems using multiple light modulators to generate the projected image. In such systems, a prism is generally used to split and recombine the light. Consequently, sealing the various light modulator or MOEMS packages to the prism (180) can improve the operation of such a system for the reasons described above.

The preceding description has been presented only to illustrate and describe embodiments of the invention. It is not intended to be exhaustive or to limit the invention to any precise form disclosed. Many modifications and variations are possible in light of the above teaching.

What is claimed is:

1. A micro-optoelectromechanical system (MOEMS) package for a light modulator, said package comprising:
   a sealed modulator package comprising a light modulator sealed under a first transparent lid;
   a secondary, larger package containing said sealed modulator package, said secondary package comprising a seal and a second transparent lid; and
   an optical material disposed between said first transparent lid and said second transparent lid, wherein said optical material is a solid, gel or liquid.

2. The package of claim 1, further comprising an aperture formed on said second transparent lid.

3. The package of claim 1, further comprising a desiccant disposed in an interior of said secondary package with said sealed modulator package.

4. The package of claim 3, wherein said desiccant is disposed on said second transparent lid.

5. The package of claim 1, further comprising a getter material disposed in an interior of said secondary package with said sealed modulator package.

6. The package of claim 5, wherein said getter material is disposed on said second transparent lid.

7. The package of claim 1, wherein said second transparent lid is sealed to a substrate with a bond to form said secondary package.

8. The package of claim 7, wherein said bond forms a hermetic seal between said second transparent lid and said substrate.

9. The package of claim 7, wherein said bond has a leak rate less than $10^{-8}$ atm.cc/sec.

10. The package of claim 1, wherein said second transparent lid comprises glass.

11. The package of claim 1, wherein said second transparent lid comprises a prism.

12. The package of claim 11, wherein a plurality of said sealed modulator packages, each in a respective secondary, larger package, are sealed to different sides of said prism.

13. The package of claim 1, wherein said optical material has an index of refraction which is substantially an average of indices of refraction of said first and second transparent lids.

14. A micro-optoelectromechanical system (MOEMS) package for a light modulator, said package comprising:
    a sealed modulator package comprising a light modulator sealed under a first transparent lid;

a secondary, larger package containing said sealed modulator package, said secondary package comprising a second transparent lid; and a desiccant or getter material disposed exterior to said sealed modulator package and inside said secondary package with said modulator package.

15. The package of claim 14, further comprising an aperture formed on said second transparent lid.

16. The package of claim 14, further comprising an optical material disposed between said first transparent lid and said second transparent lid, wherein said optical material is a solid, gel or liquid.

17. The package of claim 16, wherein said optical material has an index of refraction which is substantially an average of indices of refraction of said first and second transparent lids.

18. The package of claim 14, wherein said desiccant or getter material is desiccant disposed on said second transparent lid.

19. The package of claim 14, wherein said desiccant or getter material is getter material disposed on said second transparent lid.

20. The package of claim 14, wherein said second transparent lid is sealed to a substrate with a bond to form said secondary package.

21. The package of claim 20, wherein said bond forms a hermetic seal between said second transparent lid and said substrate.

22. The package of claim 14, wherein said second transparent lid comprises glass.

23. A micro-optoelectromechanical system (MOEMS) package for a light modulator, said package comprising:

a sealed modulator package comprising a light modulator sealed under a first transparent lid; and a secondary, larger package containing said sealed modulator package, said secondary package comprising a second transparent lid;

wherein said second transparent lid is sealed to a substrate with a bond to form said secondary package;

wherein said bond has a leak rate less than $10^{-8}$ atm.cc/sec.

24. A micro-optoelectromechanical system (MOEMS) package for a light modulator, said package comprising:

a sealed modulator package comprising a light modulator sealed under a first transparent lid; and a secondary, larger package containing said sealed modulator package, said secondary package comprising a second transparent lid;

wherein said second transparent lid comprises a prism.

25. The package of claim 24, wherein a plurality of said sealed modulator packages, each in a respective secondary, larger package, are sealed to different sides of said prism.

26. The package of claim 24, further comprising a desiccant or getter material disposed inside said secondary package with said modulator package.

27. A method of forming a micro-optoelectromechanical system (MOEMS) package for a light modulator, said method comprising:

providing a sealed modulator package comprising a light modulator sealed under a first transparent lid;

placing an optical material, which is a liquid or solid, over said sealed modulator package; and sealing said sealed modulator package in a secondary, larger package having a second transparent lid;

wherein said optical material fills a space between said first and second transparent lids.

28. The method of claim 27, further comprising forming an aperture on said second transparent lid.

29. The method of claim 27, further comprising placing a desiccant in an interior of said secondary package with said sealed modulator package.

30. The method of claim 29, further comprising disposing said desiccant on said second transparent lid.

31. The method of claim 27, further comprising placing a getter material in an interior of said secondary package with said sealed modulator package.

32. The method of claim 31, further comprising disposing said getter material on said second transparent lid.

33. The method of claim 27, further comprising sealing said second transparent lid to a substrate to form said secondary package.

34. The method of claim 33, wherein said sealing forms a hermetic seal between said second transparent lid and said substrate.

35. The method of claim 33, wherein said sealing has a leak rate less than $10^{-8}$ atm.cc/sec.

36. The method of claim 27, wherein said second transparent lid comprises glass.

37. A method of forming a micro-optoelectromechanical system (MOEMS) package for a light modulator, said method comprising:

providing a sealed modulator package comprising a light modulator sealed under a first transparent lid;

providing a desiccant or getter material exterior to said sealed modulator package; and sealing said sealed modulator package with said desiccant or getter material in a secondary, larger package having a second transparent lid.

38. The method of claim 37, further comprising forming an aperture on said second transparent lid.

39. The method of claim 37, further comprising disposing said desiccant on said second transparent lid.

40. The method of claim 37, further comprising disposing said getter material on said second transparent lid.

41. The method of claim 37, further comprising sealing said second transparent lid to a substrate to form said secondary package.

42. The method of claim 41, wherein said sealing forms a hermetic seal between said second transparent lid and said substrate.

43. The method of claim 41, wherein said sealing has a leak rate less than $10^{-8}$ atm.cc/sec.

44. The method of claim 37, wherein said second transparent lid comprises glass.

45. A method of forming a micro-optoelectromechanical system (MOEMS) package for a light modulator, said method comprising:

providing a sealed modulator package comprising a light modulator sealed under a first transparent lid;

sealing said sealed modulator package in a secondary, larger package having a second transparent lid; said method further comprising placing an optical material, which is a liquid, gel or solid, between said first transparent lid and said second transparent lid.

46. The method of claim 45, wherein said optical material has an index of refraction which is substantially an average of indices of refraction of said first and second transparent lids.

47. The method of claim 45, further comprising:

providing a desiccant or getter material; and sealing said sealed modulator package with said desiccant or getter material in said secondary, larger package.

48. The method of claim 45, further comprising forming a light aperture on said second transparent lid, said aperture being registered with said light modulator in said modulator package.

49. A micro-optoelectromechanical system (MOEMS) package for a light modulator, said package comprising:
- a sealed modulator package comprising a light modulator sealed under a first transparent lid;
- a secondary, larger package containing said sealed modulator package, said secondary package comprising a seal and a second transparent lid; and
- means for absorbing moisture disposed exterior to said sealed modulator package and inside said secondary package with said modulator package.

50. The package of claim 49, further comprising an aperture formed on said second transparent lid.

51. The package of claim 49, further comprising an optical material disposed between said first transparent lid and said second transparent lid, wherein said optical material is a solid, gel or liquid.

52. A micro-optoelectromechanical system (MOEMS) package for a light modulator, said package comprising:
- a sealed modulator package comprising a light modulator sealed under a first transparent lid;
- a secondary, larger package containing said sealed modulator package, said secondary package comprising a seal and a second transparent lid; and
- means for collecting contaminants disposed inside said secondary package with and exterior to said modulator package.

53. The package of claim 52, further comprising an aperture formed on said second transparent lid.

54. The package of claim 52, further comprising an optical material disposed between said first transparent lid and said second transparent lid, wherein said optical material is a solid, gel or liquid.

55. A micro-optoelectromechanical system (MOEMS) package for a light modulator, said package comprising:
- a sealed modulator package comprising a light modulator sealed under a first transparent lid;
- a prism; and
- a secondary, larger package containing said sealed modulator package, said secondary package being sealed to a side of said prism.

56. The package of claim 55, further comprising an optical material disposed between said first transparent lid and said prism.

57. The package of claim 56, wherein said optical material is a solid or liquid.

58. The package of claim 55, further comprising a plurality of sealed modulator packages, each comprising a light modulator, that are contained in respective secondary packages that are sealed to different sides of said prism.

59. The package of claim 55, further comprising a desiccant disposed in an interior of said secondary package with said sealed modulator package.

60. The package of claim 55, further comprising a getter material disposed in an interior of said secondary package with said sealed modulator package.

61. A method of forming a micro-optoelectromechanical system (MOEMS) package for a light modulator, said method comprising:
- providing a sealed modulator package comprising a light modulator sealed under a first transparent lid; and
- sealing said sealed modulator package in a secondary, larger package to a side of a prism.

62. The method of claim 61, further comprising placing an optical material, which is a liquid or solid, between said sealed modulator package and said prism prior to sealing said secondary package to said prism.

* * * * *

UNITED STATES PATENT AND TRADEMARK OFFICE
CERTIFICATE OF CORRECTION

| | |
|---|---|
| PATENT NO. | : 7,307,773 B2 |
| APPLICATION NO. | : 11/029316 |
| DATED | : December 11, 2007 |
| INVENTOR(S) | : Chien-Hua Chen et al. |

Page 1 of 1

It is certified that error appears in the above-identified patent and that said Letters Patent is hereby corrected as shown below:

In column 8, line 55, in Claim 45, delete "scaling" and insert -- sealing --, therefor.

Signed and Sealed this

Eighth Day of July, 2008

JON W. DUDAS
*Director of the United States Patent and Trademark Office*